United States Patent
Yang et al.

(10) Patent No.: US 11,551,958 B2
(45) Date of Patent: Jan. 10, 2023

(54) APPARATUS AND METHOD FOR TRANSFERRING WAFERS

(71) Applicant: Taiwan Semiconductor Manufacturing Company Limited, Hsinchu (TW)

(72) Inventors: Chung-Hsung Yang, Hsinchu (TW); Yung-Ho Chen, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 207 days.

(21) Appl. No.: 16/881,749

(22) Filed: May 22, 2020

(65) Prior Publication Data
US 2021/0366752 A1 Nov. 25, 2021

(51) Int. Cl.
*H01L 21/677* (2006.01)
*B65G 47/90* (2006.01)
*H01L 21/67* (2006.01)

(52) U.S. Cl.
CPC ........ *H01L 21/67718* (2013.01); *B65G 47/90* (2013.01); *H01L 21/6773* (2013.01); *H01L 21/67265* (2013.01)

(58) Field of Classification Search
CPC .............. B65G 47/90; H01L 21/67265; H01L 21/67718; H01L 21/6773; H01L 21/67781
See application file for complete search history.

(56) References Cited

U.S. PATENT DOCUMENTS

| | | | | |
|---|---|---|---|---|
| 5,730,575 A | * | 3/1998 | Nichols | H01L 21/68 414/404 |
| 5,735,662 A | * | 4/1998 | Nichols | H01L 21/67778 414/404 |
| 5,975,836 A | * | 11/1999 | Rodriguez | H01L 21/67781 414/800 |
| 7,771,157 B2 | * | 8/2010 | Farrell | H01L 21/67781 414/811 |
| 8,303,231 B2 | | 11/2012 | Yu et al. | |
| 2002/0098067 A1 | * | 7/2002 | De Luna, Jr. | H01L 21/67781 414/416.03 |
| 2009/0082895 A1 | | 3/2009 | Barker et al. | |
| 2009/0087287 A1 | * | 4/2009 | Yu | H01L 21/67772 414/217.1 |

FOREIGN PATENT DOCUMENTS

TW 201639059 A 11/2016

* cited by examiner

*Primary Examiner* — Saul Rodriguez
*Assistant Examiner* — Brendan P Tighe
(74) *Attorney, Agent, or Firm* — Foley & Lardner LLP

(57) ABSTRACT

An illustrative embodiment disclosed herein is an apparatus including a first loading tray configured to couple to a first wafer holding device holding a plurality of wafers. The first wafer holding device includes a first opening. The apparatus includes a second loading tray configured to couple to a second wafer holding device. The second wafer holding device includes a second opening. The apparatus includes a first motor coupled to the first loading tray and configured to rotate the first wafer holding device until the first opening faces the second opening to allow transfer of the plurality of wafers from the first wafer holding device to the second wafer holding device.

19 Claims, 8 Drawing Sheets

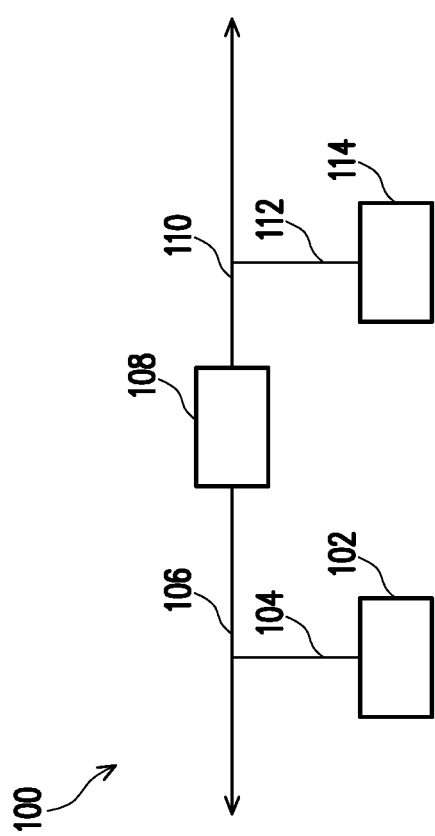

APPARATUS AND METHOD FOR TRANSFERRING WAFERS

BACKGROUND

The present application relates to a method and an apparatus for semiconductor wafer transfer, and more specifically, to a method and an apparatus for semiconductor wafer transfer between a first wafer holding device and a second wafer holding device.

Traditionally, in order to transfer the wafers from a first pod or cassette to a second pod or cassette, the user transfers wafers one by one. This requires a large amount of time and manpower. In addition, during manual transfer, the wafers are not protected by the pod housing and are unavoidably exposed to air. Under such a situation, the wafers may be contaminated, damaged or otherwise scrapped due to the user mishandling the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic block diagram of a process line, in accordance with some embodiments;

DETAILED DESCRIPTION

Figure 2A:
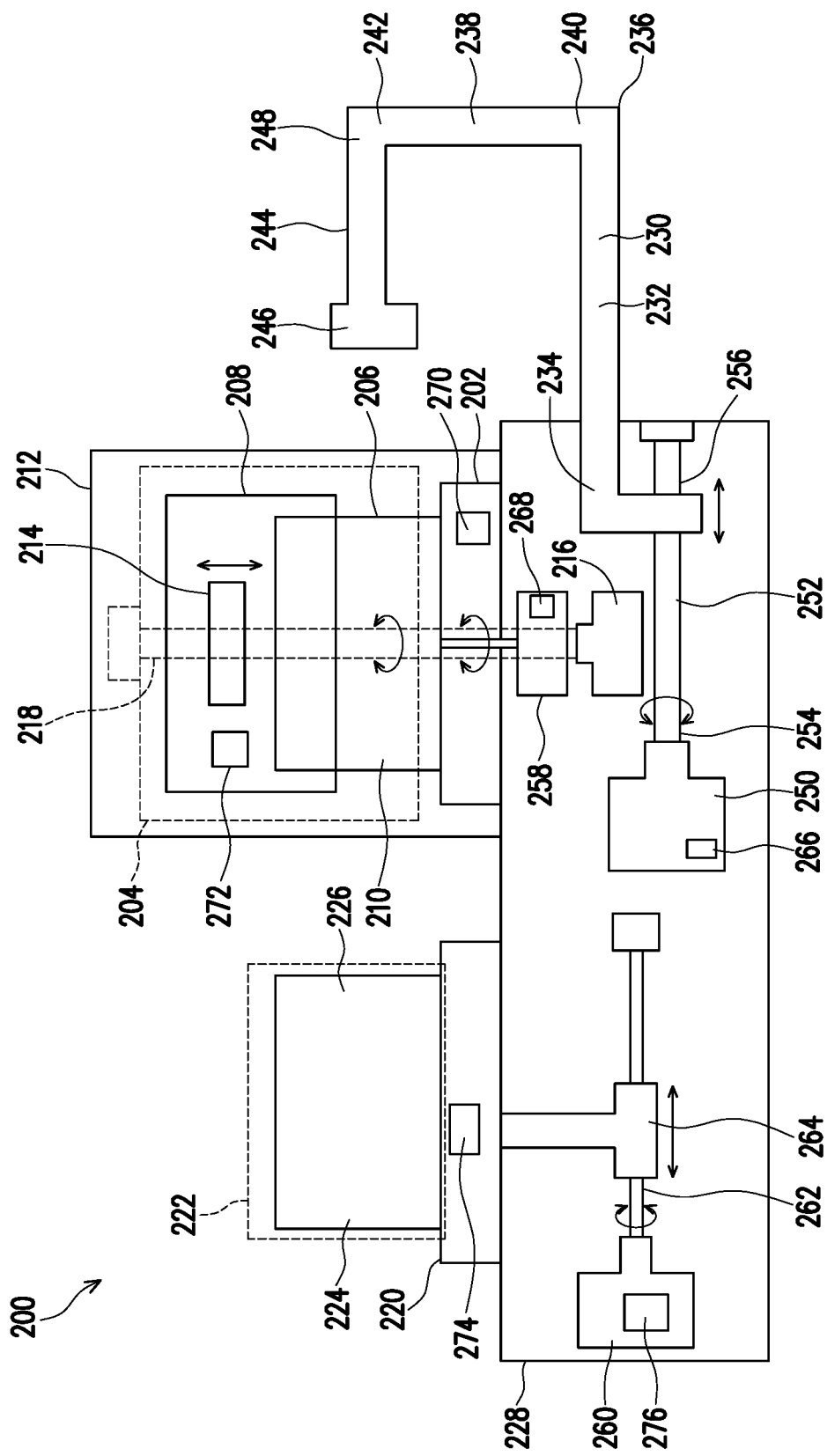
FIG. 2A is a schematic block diagram of an automatic loader for transferring wafers, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide an apparatus and a method for automatic wafer transfer. Embodiments of the present disclosure reduce or eliminate the manual work performed by a user. Various advantages may be obtained as a result of such embodiments, including, for example, improved manufacturing efficiency, reduced manpower requirements, and improved wafer transfer quality and yield (e.g., wafer contamination and wafer scrap may be reduced or eliminated).

In accordance with various embodiments of the present disclosure, an apparatus for semiconductor wafer transfer includes a first loading tray for placement of a first wafer holding device, a second loading tray for placement of a second wafer holding device, and a motor to rotate the first wafer holding device until an opening of the first wafer holding device is aligned with an opening of the second wafer holding device. In some embodiments, the apparatus includes at least one vertical lift controller for moving a wafer pod shell of at least one of the first or second wafer holding device in a vertical direction. In some embodiments, the apparatus includes a shaft for transferring a plurality of wafers from the first wafer holding device to the second wafer holding device. In some embodiments, the apparatus includes a plurality of sensors for quality control.

FIG. 1 is a schematic diagram of a process line 100, in accordance with some embodiments. The process line 100 includes a first processing station 102, a first vertical mover 104, a first conveyer belt 106, an automatic loader 108, a second conveyer belt 110, a second vertical mover 112, and a second processing station 114.

In some embodiments, the first processing station 102 is configured to perform a first processing function (e.g., lithography) on a plurality of wafers. In some embodiments, the first vertical mover 104 is configured to move the plurality of wafers from the first processing station 102 to a first wafer holding device, such as the first wafer holding device 204 with respect to FIG. 2A, located on the first conveyer belt 106. In some embodiments, the first conveyer belt 106 is configured to move the first wafer holding device to the automatic loader 108.

Figure 2B:
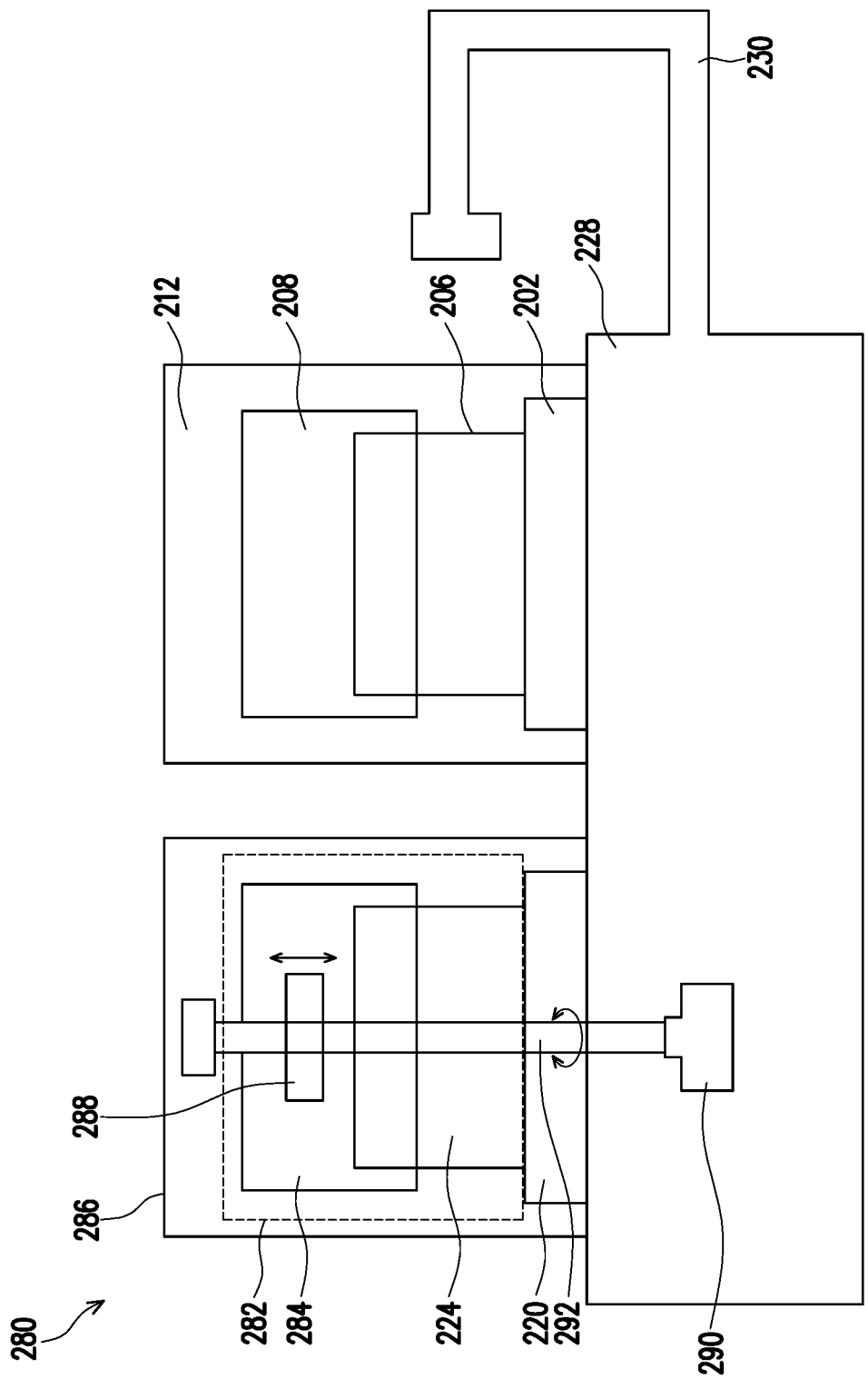
FIG. 2B is a schematic block diagram of an automatic loader for transferring wafers, in accordance with some embodiments.

The automatic loader 108 is configured to transfer the plurality of wafers from the first wafer holding device to a second wafer holding device, such as the second wafer holding device 222 as shown with respect to FIG. 2A or the second wafer holding device 282 as shown with respect to FIG. 2B. In some embodiments, the first wafer holding device is a first wafer pod, such as a first wafer pod including the first cassette 206 and the first wafer pod shell 208 as shown with respect to FIG. 2A, and the second wafer holding device is a second wafer pod, such as a second wafer pod including the second cassette 224 and the second wafer pod shell 284 as shown with respect to FIG. 2B. In some embodiments, the first wafer holding device is a first cassette, such as the first cassette 206 as shown with respect to FIG. 2A, and the second wafer holding device is a second cassette, such as the second cassette 224 as shown with respect to FIG. 2A. In some embodiments, the first wafer holding device is a wafer pod and the second wafer holding device is a cassette. In some embodiments, the first wafer holding device is a cassette and the second wafer holding device is a wafer pod.

In some embodiments, the second conveyer belt 110 is configured to move the second wafer holding device to the second vertical mover 112. In some embodiments, the second vertical mover 112 is configured to move the plurality of wafers from the second conveyer belt 110 to the second processing station 114. In some embodiments, the second processing station 114 is configured to perform a second processing function (e.g., etching) on the plurality of wafers.

The process line 100 is not limited to two processing stations, two vertical movers, two conveyer belts, and one apparatus. In some embodiments, the process line 100 includes N processing stations, N vertical movers, N conveyer belts, and N−1 apparatuses. According to still other embodiments, the numbers of processing stations, vertical movers, conveyer belts, and apparatuses may be varied.

FIG. 2A is a schematic block diagram of an automatic loader 200 for transferring wafers, in accordance with some embodiments. In some embodiments, the automatic loader 200 is similar to the automatic loader 108 referenced with respect to FIG. 1. The automatic loader 200 includes a first loading tray 202 configured to receive, and couple to, a first wafer holding device 204 including a first opening 210. The first wafer holding device 204 is configured to hold a plurality of wafers. In the embodiment of FIG. 2A, the first wafer holding device 204 includes a first cassette 206 and a first wafer pod shell 208 sealing the first cassette 206 (collectively, a wafer pod). In some embodiments, the first wafer holding device 204 includes the first cassette 206 without the first wafer pod shell 208. In some embodiments, upon receiving the first wafer holding device 204, the first loading tray 202 couples to (e.g., locks to) the first wafer pod shell 208.

The automatic loader 200 includes a first vertical lift controller 212 configured to move the first wafer pod shell 208 in a vertical direction (e.g., lift the first wafer pod shell 208 off of the first cassette 206 or lower the first wafer pod shell 208 onto the first cassette 206). In some embodiments, the first vertical lift controller 212 includes a first hook 214 configured to couple to and uncouple from the first wafer pod shell 208 and move in a vertical direction. In some embodiments, the automatic loader 200 includes a vertical lift motor 216 and a vertical lift screw 218 that is rotated by the vertical lift motor. In some embodiments, the first hook 214 is movably coupled to the vertical lift screw 218. In some embodiments, when rotating the screw in a first direction (e.g., clockwise), the first hook 214 moves in a first vertical direction (e.g., up). In some embodiments, when rotating the screw in a second direction (e.g., counter clockwise), the first hook 214 moves in a second horizontal direction (e.g., down). In some embodiments, the first vertical lift controller 212 unlocks the first wafer pod shell 208 from the first loading tray 202.

The automatic loader 200 includes a second loading tray 220 configured to receive, and couple to, a second wafer holding device 222 including a second opening 226. In the embodiment of FIG. 2A, the second wafer holding device 222 includes a second cassette 224 without a second wafer pod shell. In some embodiments, the second wafer holding device 222 includes the second cassette 224 and a second wafer pod shell, such as the second wafer pod shell 284 as shown with respect to FIG. 2B, sealing the second cassette 224 (collectively, a wafer pod). In some embodiments, the first loading tray 202 and the second loading tray 220 are arranged to have the first wafer holding device 204 and the second wafer holding device 222 on a same horizontal plane such that the wafers can be transferred from the first wafer holding device 204 to the second wafer holding device 222. In some embodiments, the first loading tray 202 and the second loading tray 220 are coupled to a platform 228.

The automatic loader 200 includes a shaft 230 configured to push, or otherwise move, the plurality of wafers from the first wafer holding device 204 to the second wafer holding device 222. In some embodiments, the shaft 230 includes a lower horizontal portion 232 with a proximal end 234 and a distal end 236. The proximal end 234 is coupled to a first motor 250 (e.g., via a screw 252). The first motor 250 is coupled to the platform 228, in some embodiments. In some embodiments, the shaft 230 includes a vertical portion 238 with a lower end 240 and an upper end 242. The lower end 240 is coupled to the distal end 236 of the lower horizontal portion 232. In some embodiments, the shaft 230 includes an upper horizontal portion 244 with a proximal end 246 and a distal end 248. The distal end 248 is coupled to the upper end 242 of the vertical portion 238. In some embodiments, the proximal end 246 of the upper horizontal portion 244 is configured to push, or otherwise move, the plurality of wafers.

In some embodiments, the automatic loader 200 includes a plurality of motors. Each motor can be a rotor motor, a stepper motor, or the like. In some embodiments, the automatic loader includes the first motor 250. In some embodiments, the first motor 250 is configured to move the shaft 230 in a horizontal direction. In some embodiments, the first motor 250 rotates a screw 252 coupled to the first motor 250 on a first end 254 and movably coupled to the shaft 230 on a first region 256. In some embodiments, when rotating the screw 252 in a first direction (e.g., clockwise), the shaft 230 moves in a first horizontal direction (e.g., away from the first wafer holding device 204). In some embodiments, when rotating the screw 252 in a second direction (e.g., counter clockwise), the shaft 230 moves in a second horizontal direction (e.g., toward the first wafer holding device 204).

In some embodiments, the automatic loader 200 includes a second motor 258 coupled to at least one of the first loading tray 202 and the first wafer holding device 204. In some embodiments, the second motor 258 is configured to rotate the first wafer holding device 204 until the first opening 210 faces the second opening 226. In some embodiments, rotating the first wafer holding device 204 to align the first opening 210 and the second opening 226 creates clearance for the transfer of the plurality of wafers from the first wafer holding device 204 to the second wafer holding device 222. In some embodiments, the second motor 258 rotates the first wafer holding device 204 and the first loading tray 202. In some embodiments, the second motor 258 rotates the first wafer holding device 204 without rotating the first loading tray 202.

In some embodiments, the automatic loader 200 includes a third motor 260 coupled to the platform 228 and configured to move the second loading tray 220 in a horizontal direction. In some embodiments, the third motor 260 rotates a screw 262 coupled to the third motor 260. In some embodiments, the screw 262 is movably coupled to a shaft 264 that is coupled to the second loading tray 220. In some embodiments, when the third motor 260 rotates the screw 262 in first direction (e.g., clockwise), the shaft 264 and the second loading tray 220 move in a first horizontal direction (e.g., toward the first loading tray 202). In some embodiments, when the third motor 260 rotates the screw 262 in second direction (e.g., counter clockwise), the shaft 264 and the second loading tray 220 move in a second horizontal direction (e.g., away from the first loading tray 202).

In some embodiments, the automatic loader 200 includes a plurality of sensors (e.g., a torque sensor, a force sensor, an optical sensor, a heat sensor, a light sensor, a sound sensor, a pressure sensor, or the like). In some embodiments, each sensor is implemented as at least one of hardware, firmware, or software. In some embodiments, each sensor implemented in firmware or software includes a memory having instructions stored thereon and a processor to fetch the instructions from the memory and execute the instructions.

In some embodiments, the automatic loader 200 includes a first sensor 266 coupled to the first motor 250. In some embodiments, the first sensor 266 is configured to monitor a torque of the first motor 250. In some embodiments, the first sensor 266 determines whether there is external interference based on the torque of the first motor 250. In some embodiments, the first sensor 266 is configured to monitor a number of rotations performed by the first motor 250. In some embodiments, the first sensor 266 is configured to determine a position of the shaft 230 and a distance between the shaft 230 and the first wafer holding device 204 based on the number of rotations performed by the first motor 250.

In some embodiments, the automatic loader 200 includes a second sensor 268 coupled to the second motor 258. In some embodiments, the second sensor 268 is configured to monitor a torque of the second motor 258. In some embodiments, the second sensor 268 is configured to monitor whether the first opening 210 faces the second opening 226. In some embodiments, the second sensor 268 is configured to monitor and identify a number of rotations performed by the second motor 258. In some embodiments, the second sensor 268 is configured to determine whether the first opening 210 faces the second opening 226 based on identifying the number of rotations performed by the second motor 258.

In some embodiments, the automatic loader 200 includes a third sensor 270 coupled to the first loading tray 202. In some embodiments, the third sensor 270 is configured to monitor whether the first opening 210 faces the second opening 226. In some embodiments, the third sensor 270 configured to monitor a position of the first wafer holding device 204, and based on the position of the first wafer holding device 204, the third sensor 270 determines whether the first opening 210 faces the second opening 226. In some embodiments, the third sensor 270 is configured to monitor whether the first wafer holding device 204 is in contact with the first loading tray 202.

In some embodiments, the automatic loader 200 includes a fourth sensor 272 coupled to the first vertical lift controller 212. In some embodiments, the fourth sensor 272 is configured to monitor a force with which the first vertical lift controller 212 moves the first wafer pod shell 208 in the vertical direction. In some embodiments, the fourth sensor 272 is configured to monitor whether or how far the first vertical lift controller 212 lifts, or otherwise moves, the first wafer pod shell 208. In some embodiments, the fourth sensor 272 is configured to monitor a position and load of the first hook 214. In some embodiments, the fourth sensor 272 is configured to determine whether or how far the first vertical lift controller 212 lifts the first wafer pod shell 208 based on the position and the load of the first hook 214.

In some embodiments, the automatic loader 200 includes a fifth sensor 274 coupled to the second loading tray 220 configured to detect whether the second wafer holding device 222 received the plurality of wafers, or at least one wafer of the plurality of wafers. In some embodiments, the automatic loader 200 includes a sixth sensor 276 coupled to the third motor 260. In some embodiments, the sixth sensor 276 is configured to monitor torque and magnitude of movement of the third motor 260. In some embodiments, the sixth sensor 276 is configured to monitor and identify a number of rotations performed by the third motor 260. In some embodiments, the sixth sensor 276 is configured to determine a distance between the first loading tray 202 and the second loading tray 220 based on identifying the number of rotations performed by the third motor 260.

FIG. 2B is a schematic block diagram of an automatic loader 280 for transferring wafers, in accordance with some embodiments. In some embodiments, the automatic loader 280 is similar to the automatic loader 200 of FIG. 2A except that the automatic loader 280 includes a second wafer holding device 282 and a second vertical lift controller 286. The second wafer holding device 282 includes the second cassette 224 and a second wafer pod shell 284. The second vertical lift controller 286 is configured to lift the second wafer pod shell 284 off of the second cassette 224. In some embodiments, the second vertical lift controller 286 includes a second hook 288 configured to couple to and uncouple from the second wafer pod shell 284 and move in a vertical direction. In some embodiments, the automatic loader 280 includes a second vertical lift motor 290 and a second vertical lift screw 292 that is rotated by the second vertical lift motor 290. In some embodiments, the second hook 288 is movably coupled to the second vertical lift screw 292. In some embodiments, when the second vertical lift motor 290 rotates the second vertical lift screw 292 in a first direction (e.g., clockwise), the second hook 288 moves in a first vertical direction (e.g., up). In some embodiments, when the second vertical lift motor 290 rotates the second vertical lift screw 292 in a second direction (e.g., counter clockwise), the second hook 288 moves in a second horizontal direction (e.g., down). In some embodiments, the second vertical lift controller 286 unlocks the second wafer pod shell 284 from the second loading tray 220.

Figure 3:
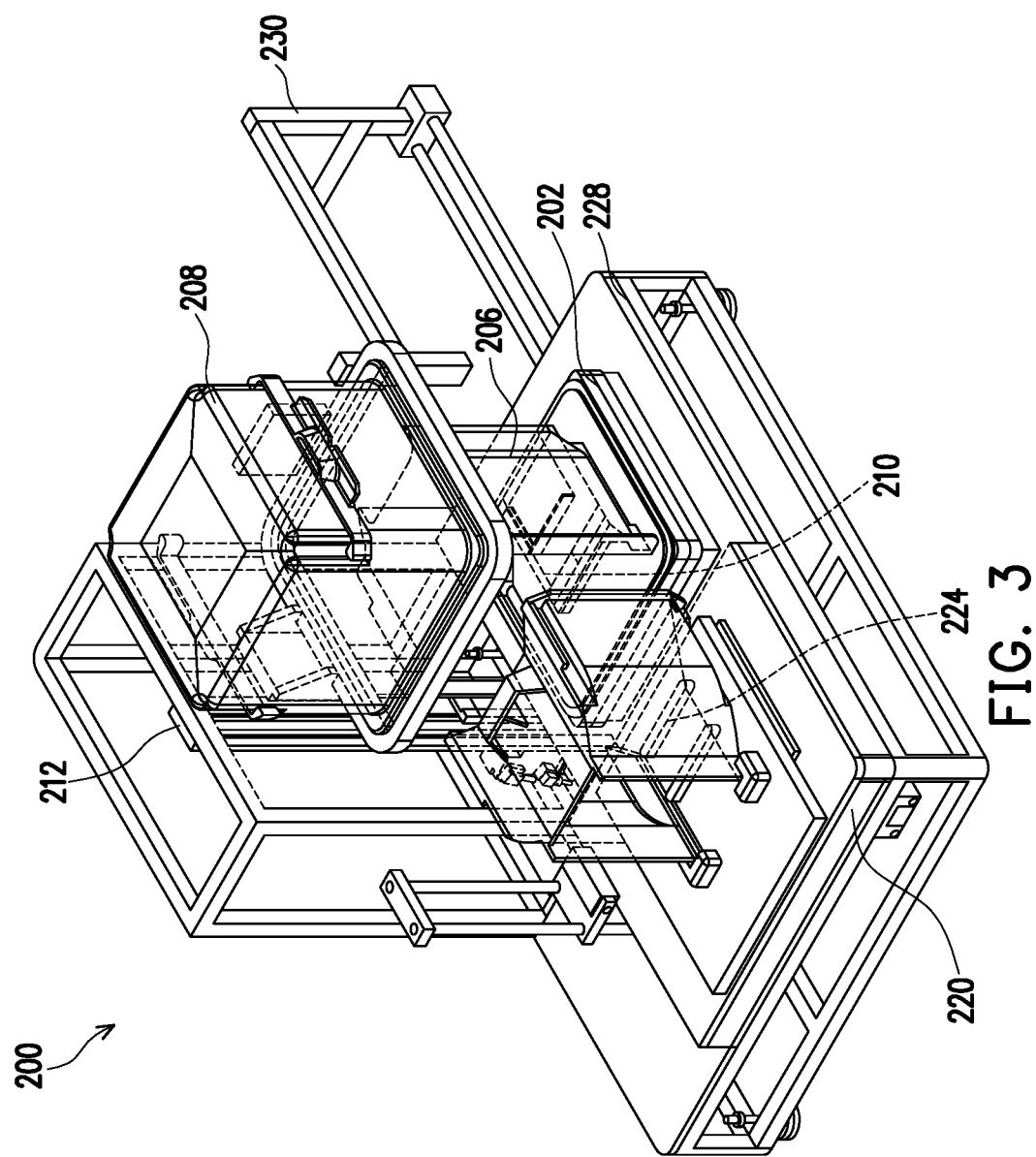
FIG. 3 is a perspective view of the automatic loader for transferring wafers shown in FIG. 2A, in accordance with some embodiments.
Figure 4:
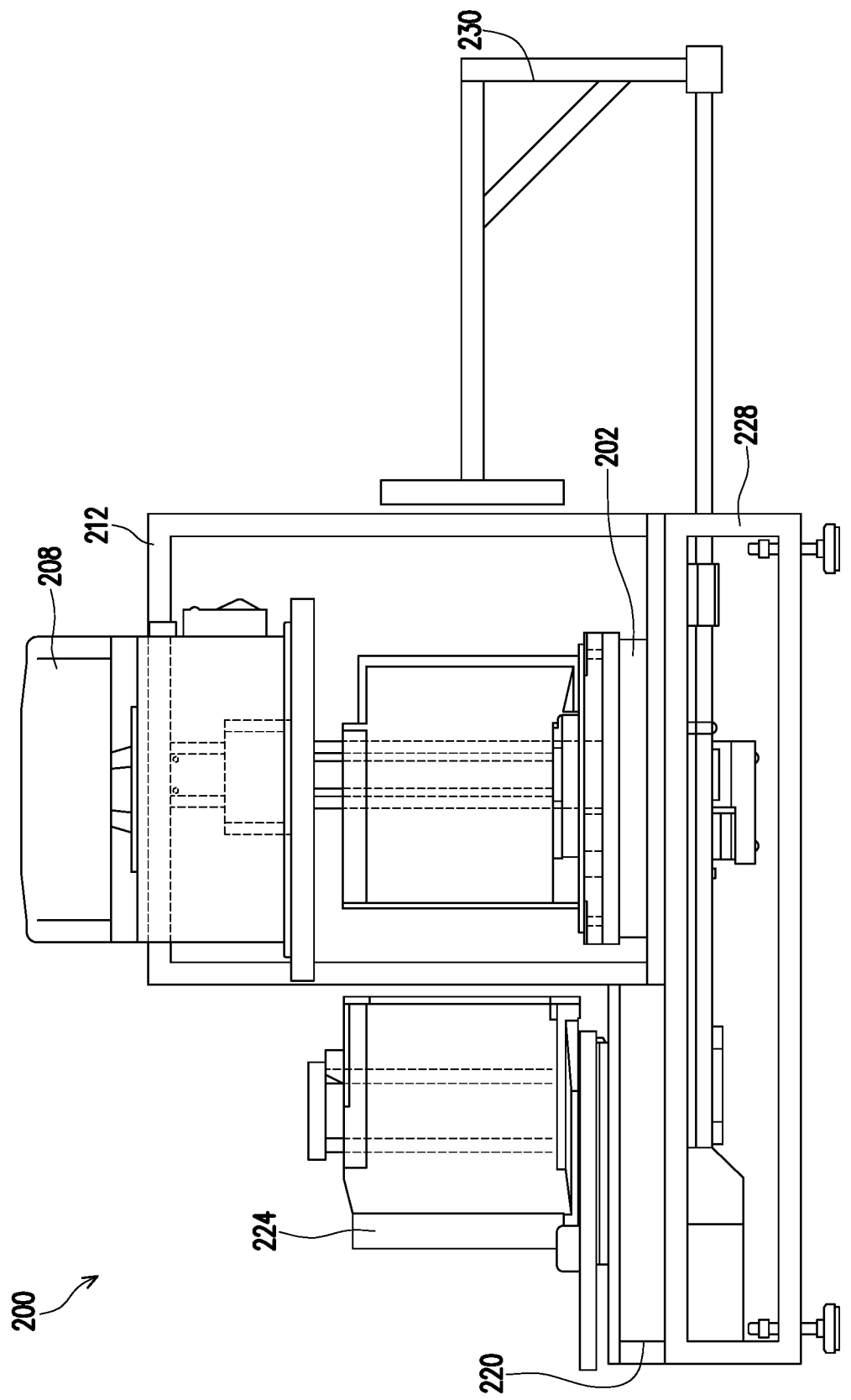
FIG. 4 is a front view of the automatic loader for transferring wafers shown in FIG. 2A, in accordance with some embodiments.
Figure 5:
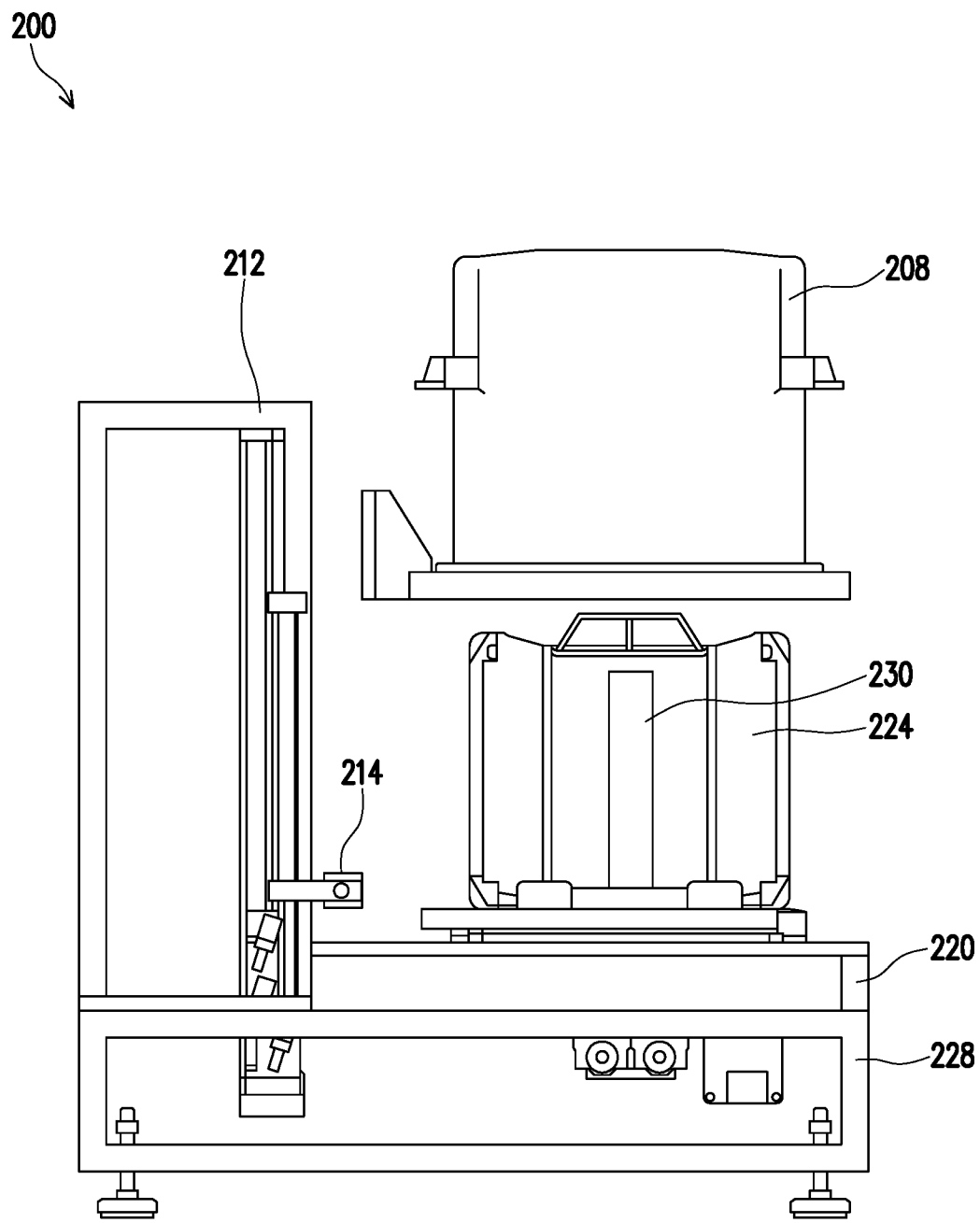
FIG. 5 is a side view of the automatic loader for transferring wafers shown in FIG. 2A, in accordance with some embodiments.
Figure 6:
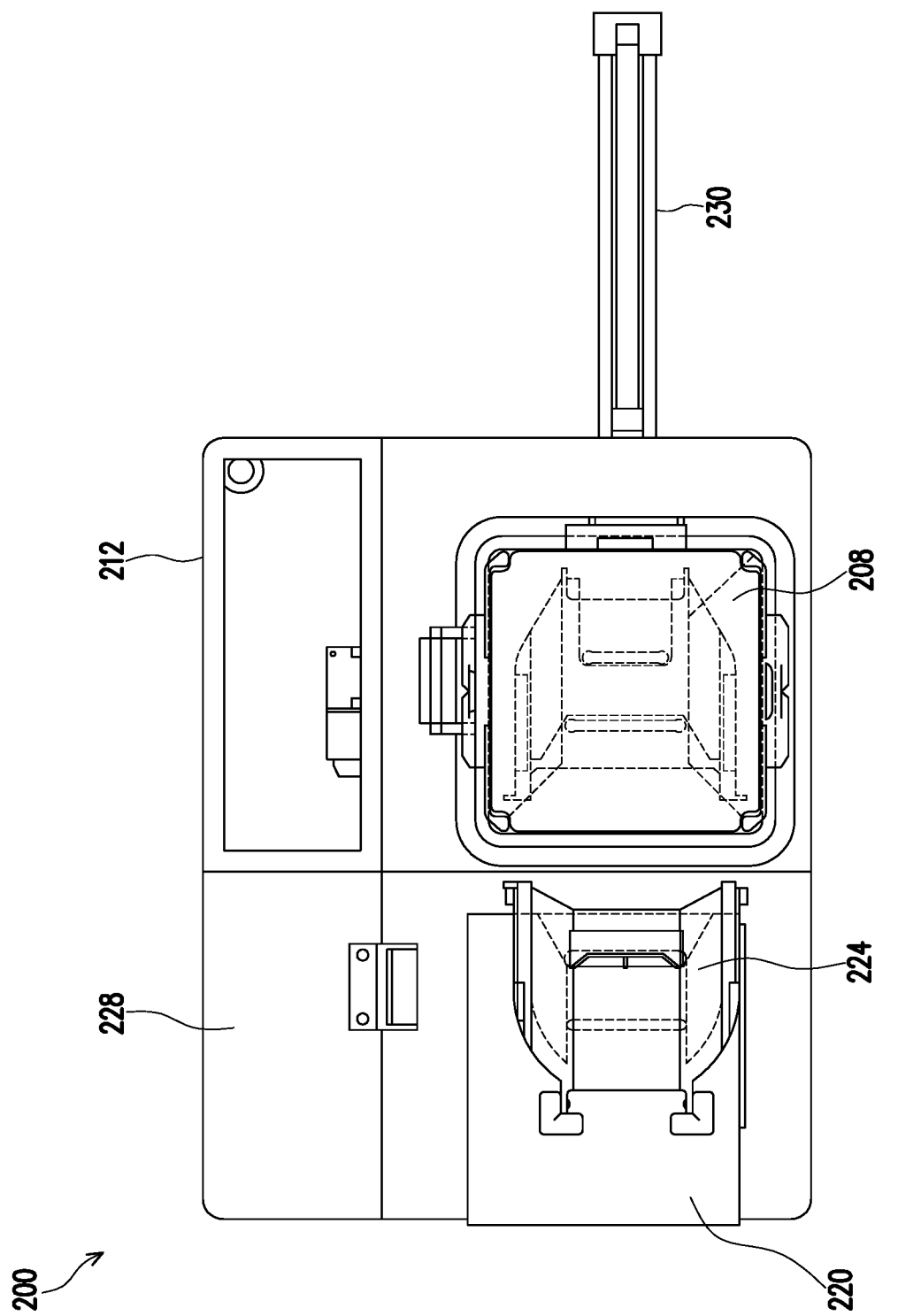
FIG. 6 is a top view of the automatic loader for transferring wafers shown in FIG. 2A, in accordance with some embodiments.

FIG. 3 is a perspective view of the automatic loader 200 for transferring wafers, in accordance with some embodiments. FIG. 4 is a front view of the automatic loader 200 for transferring wafers, in accordance with some embodiments. FIG. 5 is a diagram of a side view of the automatic loader 200 for transferring wafers, in accordance with some embodiments. FIG. 6 is a diagram of a top view of the automatic loader 200 for transferring wafers, in accordance with some embodiments.

Figure 7:
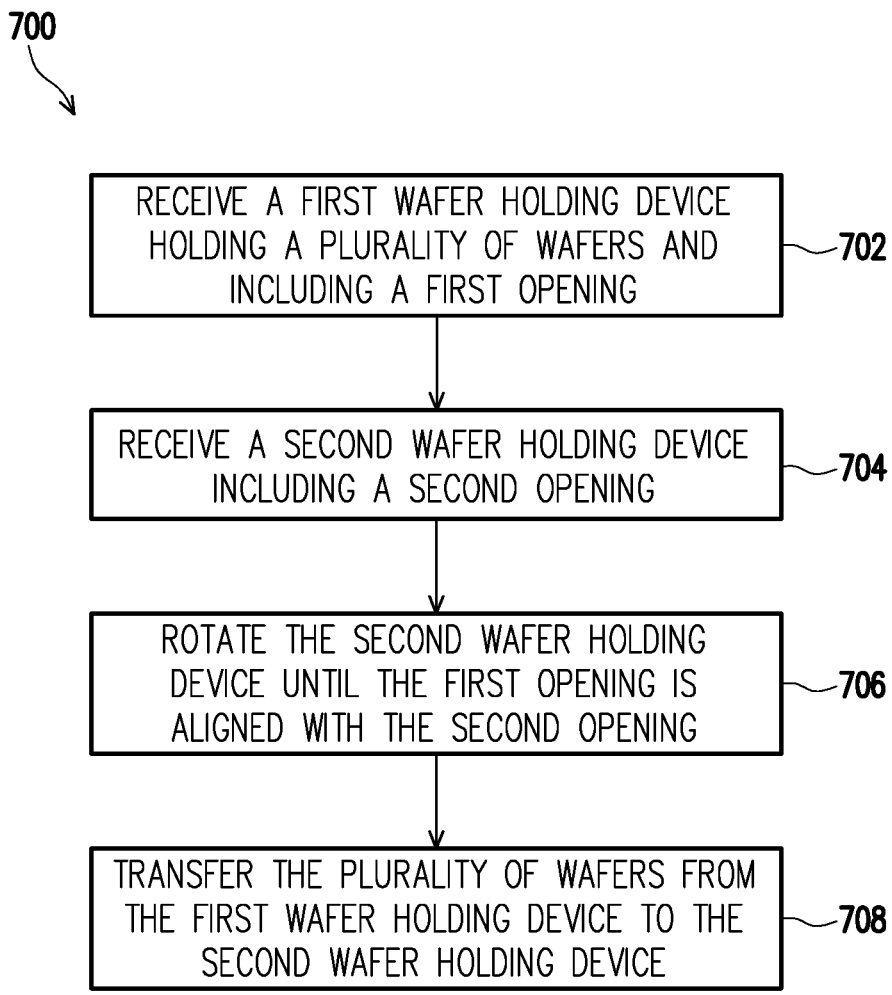
FIG. 7 is a flow chart of a method for transferring wafers, in accordance with some embodiments.

FIG. 7 is a flow chart of a method 700 for transferring wafers, in accordance with some embodiments. Additional, fewer, or different operations may be performed in the method 700 depending on the embodiment. In a step 702, an apparatus, such as the automatic loader 200, receives a first wafer holding device, such as the first wafer holding device 204, which holds a plurality of wafers and includes a first opening. In some embodiments, the first wafer holding device is received on a first loading tray, such as the first loading tray 202.

In a step 704, the apparatus receives a second wafer holding device, such as the second wafer holding device 222, which includes a second opening. In some embodiments, the second wafer holding device is received on a second loading tray, such as the second loading tray 220.

In a step 706, the apparatus rotates the second wafer holding device until the first opening is aligned with the second opening. In some embodiments, the apparatus moves the second loading tray toward the first loading tray until the first loading tray and the second loading tray are within a predetermined distance (e.g., 1 inch) of each other. In some embodiments, a sensor detects that the first loading tray and the second loading tray are within the predetermined distance of each other. In some embodiments, responsive to detecting that the first loading tray and the second loading tray are within the predetermined distance of each other, the sensor sends a signal to the apparatus, or components thereon, to stop moving the second loading tray. In a step 708, the apparatus transfers the plurality of wafers from the first wafer holding device to the second wafer holding device.

In some embodiments, the first wafer holding device is a wafer pod including a wafer pod shell, a wafer pod door detachably coupled to the wafer pod shell, and a cassette sealed by the wafer pod shell and the wafer pod door. In some embodiments, the apparatus moves the wafer pod shell in a vertical direction. In some embodiments, the apparatus unlocks the wafer pod door from the wafer pod shell. In some embodiments, the second wafer holding device includes a second wafer pod including a second wafer pod shell, a second wafer pod door, and a second cassette. In some embodiments, the apparatus moves the second wafer pod shell in the vertical direction.

One aspect of this description relates to a process line including a first wafer processing station, a second wafer processing station, and an apparatus configured to receive a first wafer holding device from the first wafer processing station. The apparatus is configured to transfer wafers from the first wafer holding device to a second wafer holding device. The apparatus is configured to send the second wafer holding device to the second wafer processing station. In some embodiments, the first wafer holding device is a first wafer pod and the second wafer holding device is a second wafer pod. In some embodiments, the first wafer pod includes a wafer pod shell and a cassette sealed by the wafer pod shell. In some embodiments, the apparatus is configured to move the wafer pod shell in a vertical direction until there a predetermined clearance between the wafer pod shell and the cassette is satisfied. In some embodiments, the apparatus includes a sensor configured to monitor whether the predetermined clearance between the wafer pod shell and the cassette is satisfied. In some embodiments, the apparatus is configured to rotate the first wafer holding device until a first opening of the first wafer holding device is facing a second opening of the second wafer holding device. In some embodiments, the apparatus includes a sensor configured to monitor whether the first opening faces the second opening. In some embodiments, the apparatus includes a sensor configured to detect whether the plurality of wafers are received by the second wafer holding device.

Another aspect of this description relates to an apparatus including a first loading tray configured to couple to a first wafer holding device holding a plurality of wafers. The first wafer holding device includes a first opening. The apparatus includes a second loading tray configured to couple to a second wafer holding device. The second wafer holding device includes a second opening. The apparatus includes a first motor coupled to the first loading tray. The first motor is configured to rotate the first wafer holding device until the first opening faces the second opening to allow transfer of the plurality of wafers from the first wafer holding device to the second wafer holding device. In some embodiments, the apparatus includes a sensor configured to monitor whether the first opening faces the second opening. In some embodiments, the first wafer holding device includes a wafer pod including a wafer pod shell and a cassette sealed by the wafer pod shell. In some embodiments, the apparatus includes a vertical lift controller configured to move the wafer pod shell in a vertical direction and a first sensor configured to monitor a force with which the vertical lift controller moves the wafer pod shell in the vertical direction. In some embodiments, the apparatus includes a second sensor configured to detect whether the wafer pod shell is lifted. In some embodiments, the second wafer holding device includes a second wafer pod including a second wafer pod shell and a second cassette sealed by the second wafer pod shell. In some embodiments, the apparatus includes a second vertical lift controller configured to move the second wafer pod shell in the vertical direction. In some embodiments, the apparatus includes a shaft configured to transfer the plurality of wafers from the first wafer holding device to the second wafer holding device and a second motor coupled to the shaft. In some embodiments, the second motor is configured to move the shaft in a horizontal direction. In some embodiments, the apparatus includes a sensor configured to monitor a torque of the second motor. In some embodiments, the second loading tray is configured to move the second wafer holding device toward the first wafer holding device. In some embodiments, the apparatus includes a sensor to determine a distance between the first wafer holding device and the second wafer holding device. In some embodiments, the apparatus includes a sensor configured to detect whether the plurality of wafers are received by the second wafer holding device.

Another aspect of this description relates to a method including receiving a first wafer holding device holding a plurality of wafers. The first wafer holding device includes a first opening. The method includes receiving a second wafer holding device including a second opening, rotating the second wafer holding device until the first opening is aligned with the second opening, and transferring the plurality of wafers from the first wafer holding device to the second wafer holding device. In some embodiments, the first wafer holding device includes a wafer pod including a wafer pod shell, a wafer pod door detachably coupled to the wafer pod shell, and a cassette sealed by the wafer pod shell and the wafer pod door. In some embodiments, the method includes moving the wafer pod shell in a vertical direction. In some embodiments, the method includes unlocking the wafer pod door from the wafer pod shell. In some embodiments, the second wafer holding device includes a second wafer pod including a second wafer pod shell, a second wafer pod door, and a second cassette. In some embodiments, the method includes moving the second wafer pod shell in the vertical direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process line, comprising
a first wafer processing station;
a second wafer processing station; and
an apparatus configured to:
receive a first wafer holding device from the first wafer processing station;
rotate the first wafer holding device until a first opening of the first wafer holding device is facing a second opening of the second wafer holding device;
transfer wafers from the first wafer holding device to a second wafer holding device; and
send the second wafer holding device to the second wafer processing station.

2. The process line of claim 1, wherein the first wafer holding device is a first wafer pod and the second wafer holding device is a second wafer pod.

3. The process line of claim 2, wherein the first wafer pod includes a wafer pod shell and a cassette sealed by the wafer pod shell, the apparatus is further configured to move the wafer pod shell in a vertical direction until there a predetermined clearance between the wafer pod shell and the cassette is satisfied.

4. The process line of claim 3, wherein the apparatus includes a sensor configured to monitor whether the predetermined clearance between the wafer pod shell and the cassette is satisfied.

5. The process line of claim 1, wherein the apparatus includes a sensor configured to monitor whether the first opening faces the second opening.

6. The process line of claim 1, wherein the apparatus includes a sensor configured to detect whether the plurality of wafers are received by the second wafer holding device.

7. An apparatus, comprising:
a first loading tray configured to couple to a first wafer holding device holding a plurality of wafers, the first wafer holding device including a first opening;
a second loading tray configured to couple to a second wafer holding device, the second wafer holding device including a second opening; and
a first motor coupled to the first loading tray, the first motor configured to rotate the first wafer holding device until the first opening faces the second opening to allow transfer of the plurality of wafers from the first wafer holding device to the second wafer holding device.

8. The apparatus of claim 7, further comprising a sensor configured to monitor whether the first opening faces the second opening.

9. The apparatus of claim 7, wherein the first wafer holding device includes a wafer pod including a wafer pod shell and a cassette sealed by the wafer pod shell, the apparatus further comprising:
a vertical lift controller configured to move the wafer pod shell in a vertical direction; and
a first sensor configured to monitor a force with which the vertical lift controller moves the wafer pod shell in the vertical direction.

10. The apparatus of claim 9, further comprising a second sensor configured to detect whether the wafer pod shell is lifted.

11. The apparatus of claim 9, wherein the second wafer holding device includes a second wafer pod including a second wafer pod shell and a second cassette sealed by the second wafer pod shell, the apparatus further comprising a second vertical lift controller configured to move the second wafer pod shell in the vertical direction.

12. The apparatus of claim 7, the apparatus further including:
a shaft configured to transfer the plurality of wafers from the first wafer holding device to the second wafer holding device; and
a second motor coupled to the shaft, the second motor configured to move the shaft in a horizontal direction.

13. The apparatus of claim 12, further comprising a sensor configured to monitor a torque of the second motor.

14. The apparatus of claim 7, wherein the second loading tray is configured to move the second wafer holding device toward the first wafer holding device, the apparatus further comprising a sensor to determine a distance between the first wafer holding device and the second wafer holding device.

15. The apparatus of claim 7, further comprising a sensor configured to detect whether the plurality of wafers are received by the second wafer holding device.

16. A method, comprising:
receiving a first wafer holding device holding a plurality of wafers, the first wafer holding device including a first opening;
receiving a second wafer holding device including a second opening;
rotating the second wafer holding device until the first opening is aligned with the second opening; and
transferring the plurality of wafers from the first wafer holding device to the second wafer holding device.

17. The method of claim 16, wherein the first wafer holding device includes a wafer pod including a wafer pod shell, a wafer pod door detachably coupled to the wafer pod shell, and a cassette sealed by the wafer pod shell and the wafer pod door, the method further comprising moving the wafer pod shell in a vertical direction.

18. The method of claim 17, further comprising unlocking the wafer pod door from the wafer pod shell.

19. The method of claim 17, wherein the second wafer holding device includes a second wafer pod including a second wafer pod shell, a second wafer pod door, and a second cassette, the method further comprising moving the second wafer pod shell in the vertical direction.

* * * * *